(12) United States Patent
Steffensmeier

(10) Patent No.: US 6,452,330 B1
(45) Date of Patent: Sep. 17, 2002

(54) INTERCONNECT BUMP FOR FLAT PANEL DISPLAYS

(75) Inventor: Martin J. Steffensmeier, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/401,232

(22) Filed: Sep. 23, 1999

(51) Int. Cl.[7] .............................. H01J 1/88; H01J 17/04; H01J 61/06
(52) U.S. Cl. ..................... 313/505; 313/506; 313/584
(58) Field of Search .................... 313/495, 505, 313/506, 510, 513, 584, 585, 586; 315/169.3, 169.4; 345/36, 41, 45, 47, 50, 55, 60, 75, 76; 428/9, 17, 690

(56) References Cited

U.S. PATENT DOCUMENTS

| 5,773,931 A | * | 6/1998 | Shi et al. ................. 313/505 X |
| 6,111,356 A | * | 8/2000 | Roitman et al. ............ 313/506 |
| 6,140,766 A | * | 10/2000 | Oakada et al. .............. 313/506 |

* cited by examiner

*Primary Examiner*—Ashok Patel
(74) *Attorney, Agent, or Firm*—Nathan O. Jensen; Kyle Eppele

(57) ABSTRACT

Each element of the display includes a first electrode disposed on a transparent, insulating substrate. A second electrode is disposed over the first electrode. An interconnect bump of photoresist is formed between the first electrode and the second electrode within one or more elements of the display to extend the second electrode away from the insulating substrate so the second electrode may be operably coupled to an interconnect substrate.

15 Claims, 21 Drawing Sheets

INTERCONNECT BUMP FOR FLAT PANEL DISPLAYS

BACKGROUND OF THE INVENTION

The present invention relates generally to flat panel light emitting devices such as flat panel displays, backlights for instrumentation displays, and the like, and more specifically to a flat panel light emitting device such as a flat panel display having an interconnect bump for coupling elements of the display to an interconnect substrate.

Flat panel polymer light emitting diode (PLED) devices are comprised of layers of conjugated, semiconducting polymers sandwiched between electrodes formed on a transparent, insulating glass or plastic substrate. When a current is passed between the electrodes, the molecular structure of the semi-conducting polymer layers is excited, creating light emission.

In one application, PLED devices may be pixilated (i.e., partitioned into picture elements or pixels) to facilitate use of the device as a flat panel display. Typically, in such displays, a PLED pixel web is formed by depositing a first electrode (anode) layer that is divided into a plurality of rows. One or more layers of semi-conducting polymers are then deposited over the first electrode layer. A second electrode (cathode) layer is next formed over the first electrode layer and semi-conducting polymer layers. The second electrode layer is partitioned into a plurality of columns oriented so as to intersect the rows of the first electrode layer. In this manner, the area of intersection of each row and column may define a display element, one or more of which may be grouped to form a pixel of the PLED pixel web. An interconnect substrate is employed to couple the PLED pixel web to a display driver for controlling the operation of pixels within the PLED pixel web.

One problem encountered in the manufacture of flat panel displays employing large PLED pixel webs (i.e., webs having large numbers of pixels) is that the duty cycle of such displays becomes low making the displays inefficient. Segmenting the pixels of the PLED pixel web into rows may reduce this lack of efficiency. Connections may then be made between groups of rows or individual rows and column line segments formed on the interconnect substrate. However, the interconnection of a large PLED pixel web to an interconnect substrate is at present difficult since no efficient interconnect technology exists. Thus, a PLED flat panel display utilizing complex interconnect patterning becomes expensive to manufacture placing it at a cost disadvantage when compared to other display technologies.

SUMMARY OF THE INVENTION

Accordingly, the present invention is directed to a method of forming interconnect bumps within the pixel web of a flat panel light emitting device, wherein the interconnect bumps may be utilized to make connections to an interconnect substrate of the flat panel light emitting device.

In accordance with one aspect of the invention, a flat panel display is comprised of a plurality of display elements formed on a transparent, insulating substrate. Interconnect bumps formed in the pixel web operably couple the display elements to an interconnect substrate. In an embodiment of the invention, the pixel web comprises a conjugated polymer light emitting diode (PLED) pixel web of a flat panel display. The PLED pixel web is comprised of layers of conjugated, semiconducting polymers including a hole transport layer (HTL) and an electron transport layer (ETL) formed between first and second electrode layers on an insulating substrate. The interconnect bump is formed beneath the second electrode layer on one of the insulating substrate, the first electrode layer, the hole transport layer (HTL), and the electron transport layer (ETL) for extending the second electrode layer away from the insulating substrate so the second electrode layer may be operably coupled to an interconnect substrate.

In accordance with a further aspect of the invention, a method of forming an interconnect bump in a flat panel display is disclosed. In one embodiment, the method includes the steps of depositing a first electrode layer on a transparent, insulating substrate, forming a bump of photoresist over the insulating substrate, and depositing a second electrode layer over the first electrode layer and the deposited bump wherein the bump extends the second electrode layer away from the insulating substrate so the second electrode layer may be operably coupled to an interconnect substrate. In exemplary embodiments, the method may further include the steps of forming a hole transport layer (HTL) on the first electrode layer and forming an electron transport layer (ETL) on the hole transport layer wherein the bump is formed on one of, the insulating substrate, the first electrode layer, the hole transport layer (HTL), and the electron transport layer (ETL).

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DESCRIPTION OF THE PREFERRED EMBODIMENT

Figure 1:
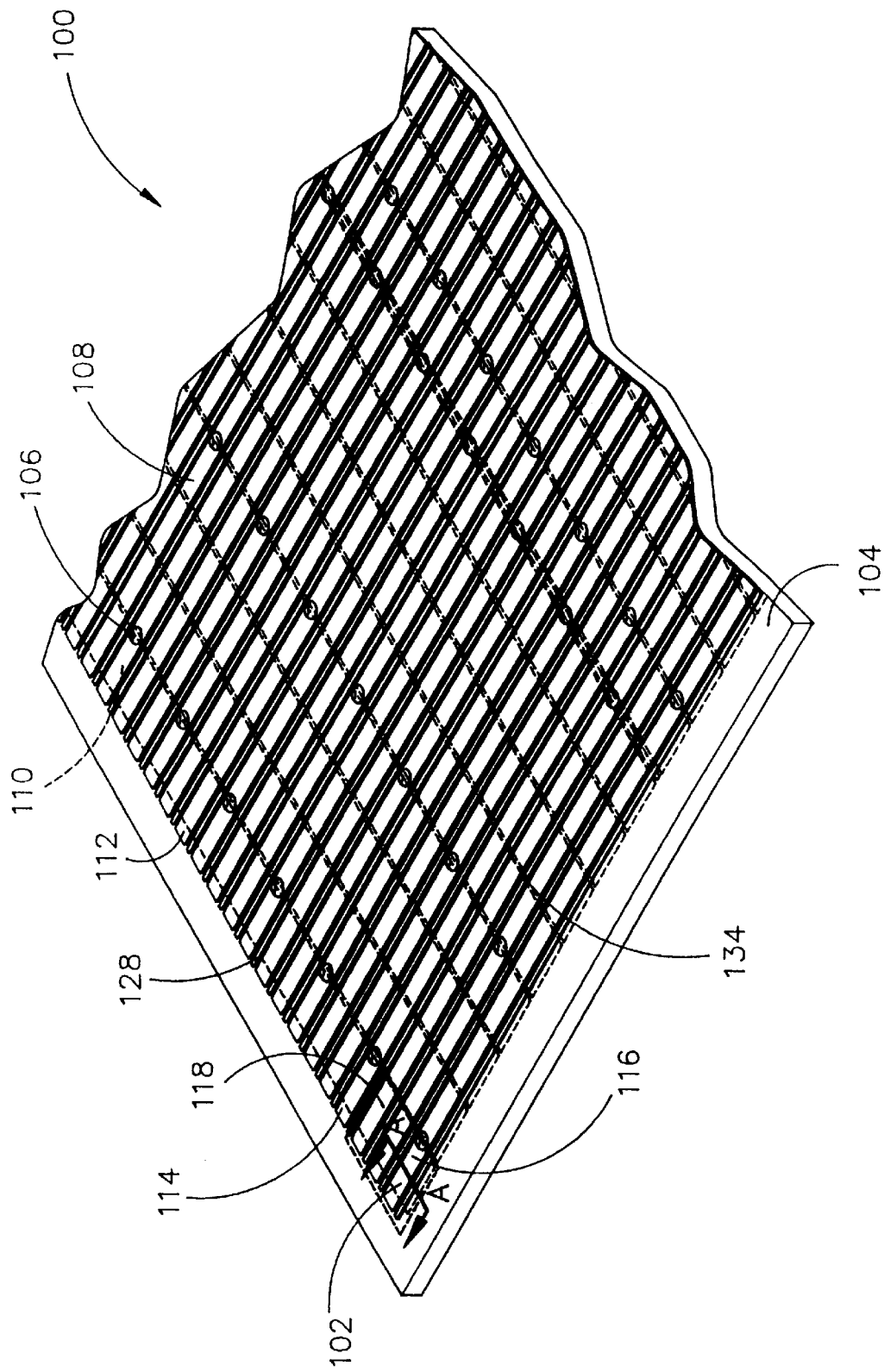
FIG. 1 is an isometric view of a PLED pixel web of a flat panel display in accordance with an exemplary embodiment of the present invention wherein the PLED pixel web is comprised of eight rows per segment and wherein the interconnect bumps are formed between rows.

Reference will now be made in detail to the presently preferred embodiments of the invention, examples of which are illustrated in the accompanying drawings.

Referring now to FIGS. 1 through 4, pixel webs of flat panel light emitting devices in accordance with exemplary embodiments of the present invention are described. The structure of the pixel webs shown in FIGS. 1 through 4, is characteristic of conjugated polymer light emitting diode (PLED) pixel webs utilized by PLED flat panel displays. Each PLED pixel web 100 is comprised of a web of semi-conducting polymer based light emitting picture elements or pixels 102 formed on a transparent, insulating substrate 104. The present invention is directed to a method of forming interconnects 106 within a pixel web such as the PLED pixel webs 100 of FIGS. 1 through 4 for operably coupling the PLED pixel web 100 to an interconnect substrate (not shown). The interconnect substrate may then couple the flat panel display to a display driver for controlling operation of pixels within the PLED pixel web 100.

In exemplary embodiments shown in FIGS. 1 through 4, the PLED pixel web 100 includes a first electrode layer 108 formed into a plurality of strips or rows 110 on insulating substrate 104. One or more layers of semi-conducting polymer materials (see FIG. 5) are formed over the first electrode layer 108. A second electrode layer 112 is formed over the first electrode layer 108 and semi-conducting polymer layers. The second electrode layer 112 is partitioned into a plurality of strips or columns 114 oriented so as to intersect the rows 110 of the first electrode layer 108. The area of intersection 116 of each row 110 and column 114 defines a display element 118, one or more of which may be grouped to form a picture element or pixel 102 of the PLED pixel web 100 (see FIG. 6). It should be appreciated that the terms "row" and "column" are used herein to describe the nature of the intersection 116 of the first and second electrode layers 108 & 112 and are not meant to indicate an orientation (e.g., horizontal or vertical) of the pixel web or flat panel display nor should such orientation be implied.

Figure 3:
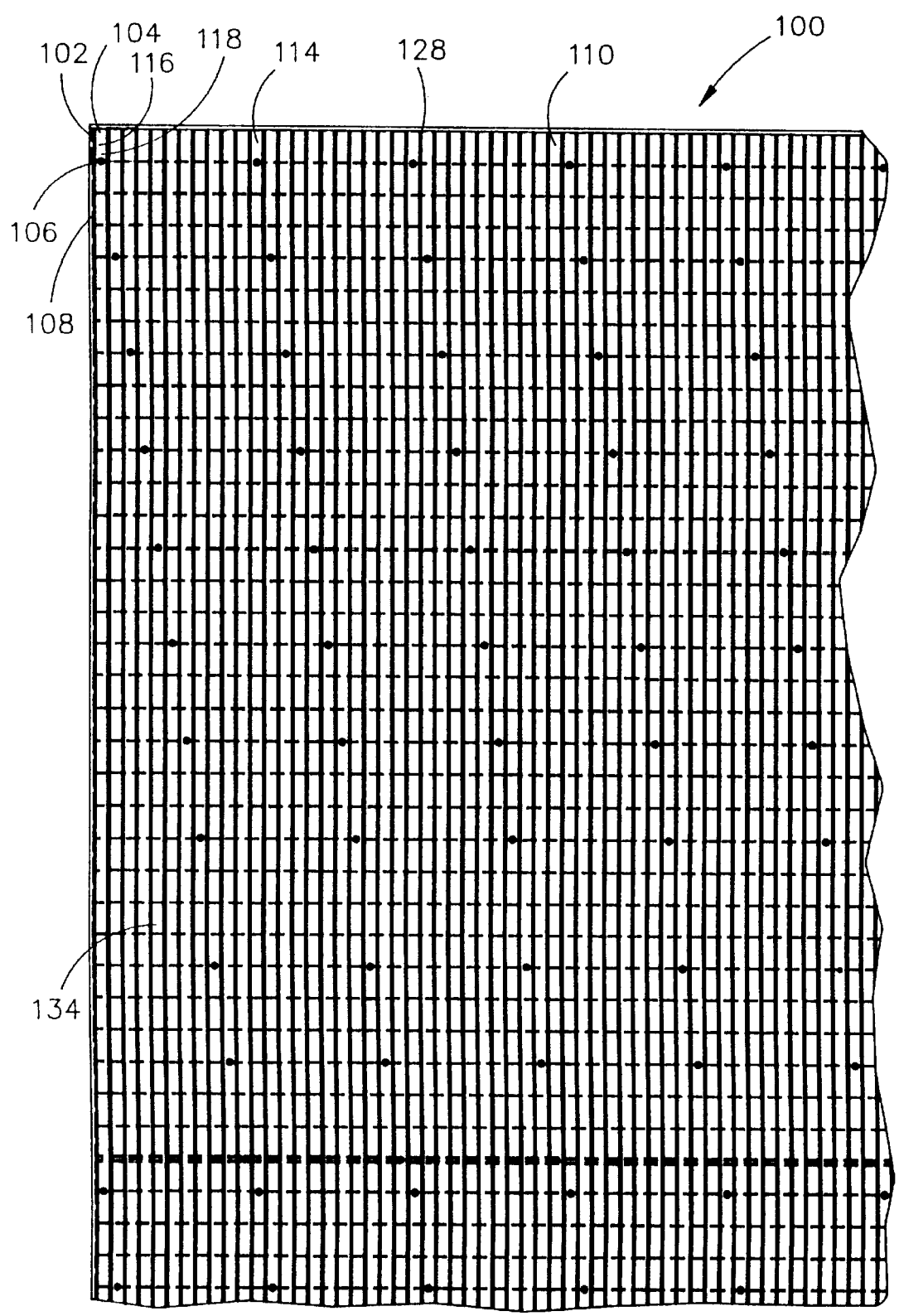
FIG. 3 is an isometric view of a PLED pixel web of a flat panel display in accordance with an exemplary embodiment of the present invention wherein the PLED pixel web is comprised of thirty-two rows per segment and wherein the interconnect bumps are formed between rows.
Figure 4:
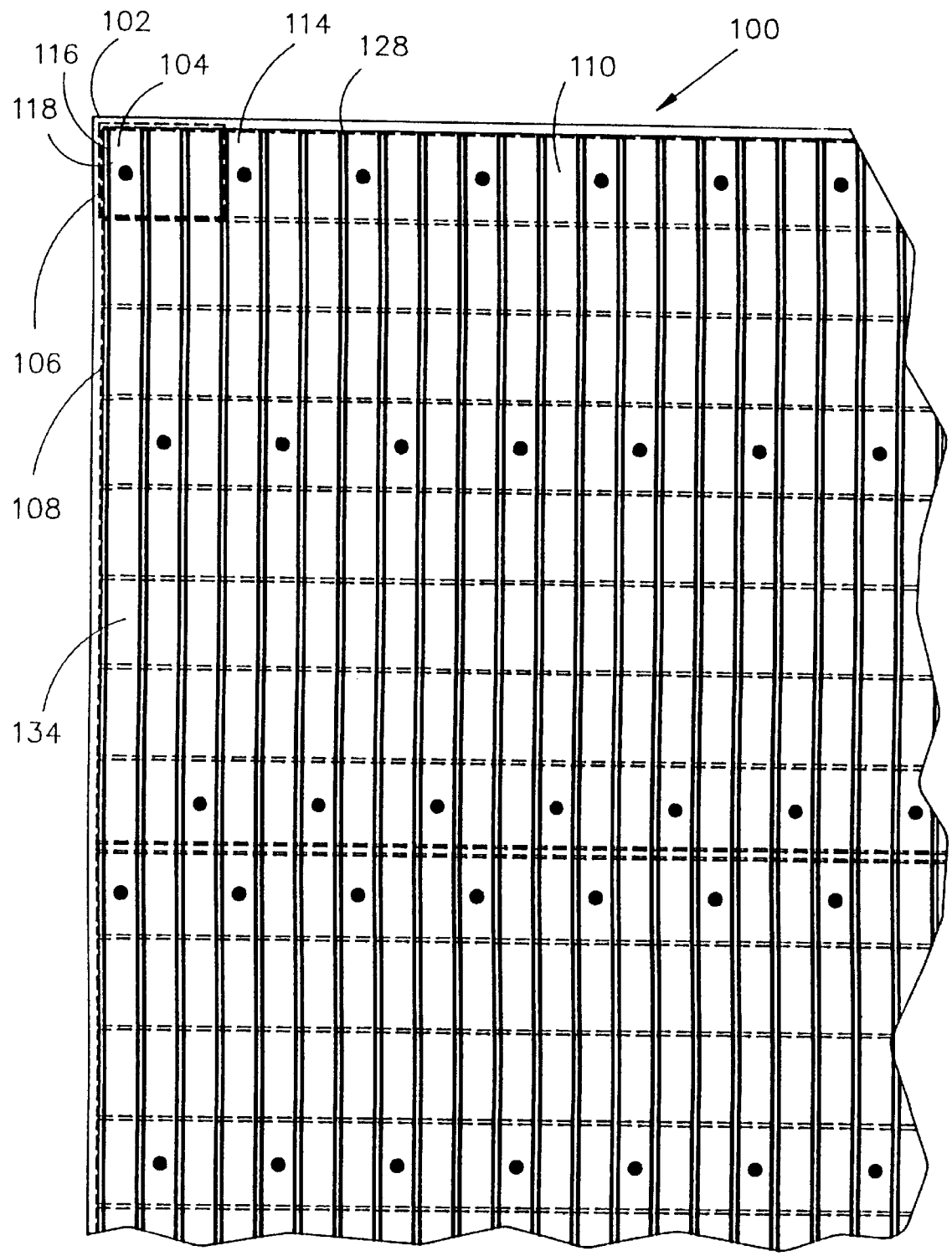
FIG. 4 is an isometric view of a PLED pixel web of a flat panel display in accordance with an alternate embodiment of the present invention wherein the PLED pixel web is comprised of eight rows per segment and wherein the interconnect bumps are formed within rows.
Figure 5:
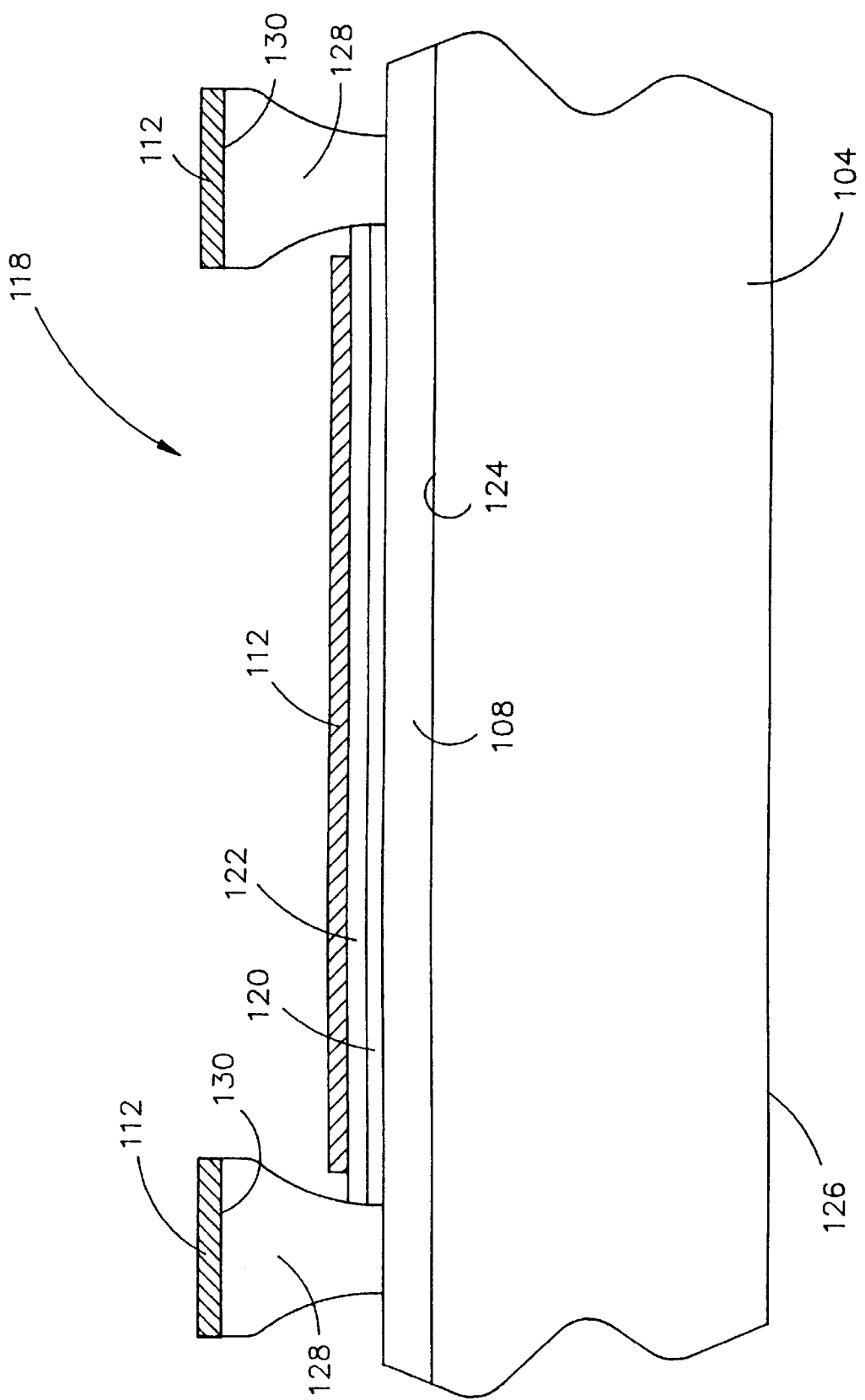
FIG. 5 is a cross-sectional side elevational view of a display element of the PLED pixel web shown in FIG. 1 taken along line A—A.

Turning now to FIG. 5, the structure of an exemplary display element of the PLED pixel webs of FIGS. 1 through 4 is shown. Display element 118 includes first electrode layer 108 formed on the transparent, insulating substrate 104, as shown in FIG. 1. Substrate 104 may be formed of a suitable material such as plastic or glass. In a preferred embodiment, substrate 104 is comprised of a substantially transparent, flexible plastic material. Such materials may be more resistant to damage than rigid substrates such as glass, and may allow the flat panel display to be curved, and even be made flexible.

A hole transport layer (HTL) 120 is formed over the first electrode layer 108. An electron transport layer (ETL) 122 is formed over the hole transport layer 120. Hole transport layer 120 and electron transport layer 122 are preferably formed of conjugated semi-conducting polymer materials including, but not limited to, doped polyaniline and polypyrrole. In exemplary embodiments, the hole transport layer 120 and electron transport layer 122 are like the second electrode layer 112, partitioned into strips or columns disposed beneath columns 114.

The second electrode layer 112 is formed over the electron transport layer 122. Preferably, the first electrode layer 108 functions as an anode for the display element 118 while the second electrode layer 112 functions as a cathode. In this manner, when a current is passed between the first and second electrode layers 108 & 112 of display element 118, the molecular structure of the semi-conducting polymer materials forming the hole transport and electron transport layers 120 & 122 is excited, creating light emission.

In an exemplary embodiment, the first electrode layer 108, which is preferably transparent to allow transmission of light, is formed of a substantially transparent conducting material such as Indium Tin Oxide (ITO), deposited on the inner surface 124 (i.e., the surface opposite the flat panel display's viewing surface 126) of insulating substrate 104. Unlike the first electrode layer 108, the second electrode layer 112 need not be transparent. Thus, the second electrode layer 112 may be formed of an opaque material such as calcium or like electrode material capable of easily releasing electrons into the electron transport layer. Alternately, the second electrode layer may also be formed of a transparent.

It will be appreciated that, although the substrate 104 and first electrode layer 108 are described herein as being substantially transparent to allow transmission of light, it may be desirable to utilize translucent or tinted substrates in some applications. Such modification of the substrate 104 and first electrode layer 108 by those of ordinary skill in the art is within the scope and spirit of the present invention.

As shown in FIGS. 1 through 5, one or more ribs 128 may be formed within the PLED pixel web 100. These ribs 128 perform a patterning function by separating the second electrode layer 112 into the unique column electrodes or columns 114. For instance, in the exemplary embodiments shown in FIGS. 1 though 4, ribs 128 are formed between each column 114 of the second electrode layer 112 so that they, like the columns 114 of second electrode layer 112, intersect the rows 110 of the first electrode layer 108. In exemplary embodiments, the ribs 128 may further partition the hole transport layer 120 and electron transport layer 122 into strips or columns disposed beneath the second electrode layer columns 114.

As shown in FIG. 5, the ribs 128 may be formed of photoresist deposited over the first electrode layer 108 and insulating substrate 104. The second electrode layer 112 may be formed over the electron transport layer 122 and the top surface 130 of each rib 128. Since the ribs extend above the electron transport layer 122, as shown in FIG. 5, the second electrode layer 112 is partitioned so that no contact exists between the second electrode layers of adjacent columns. In embodiments of the invention, ribs 128 may be formed of either positive or negative photoresist. Further, the shape of the ribs 128 may be controlled by modifying the exposure source collimation or position or the photoresist itself.

Figure 6:
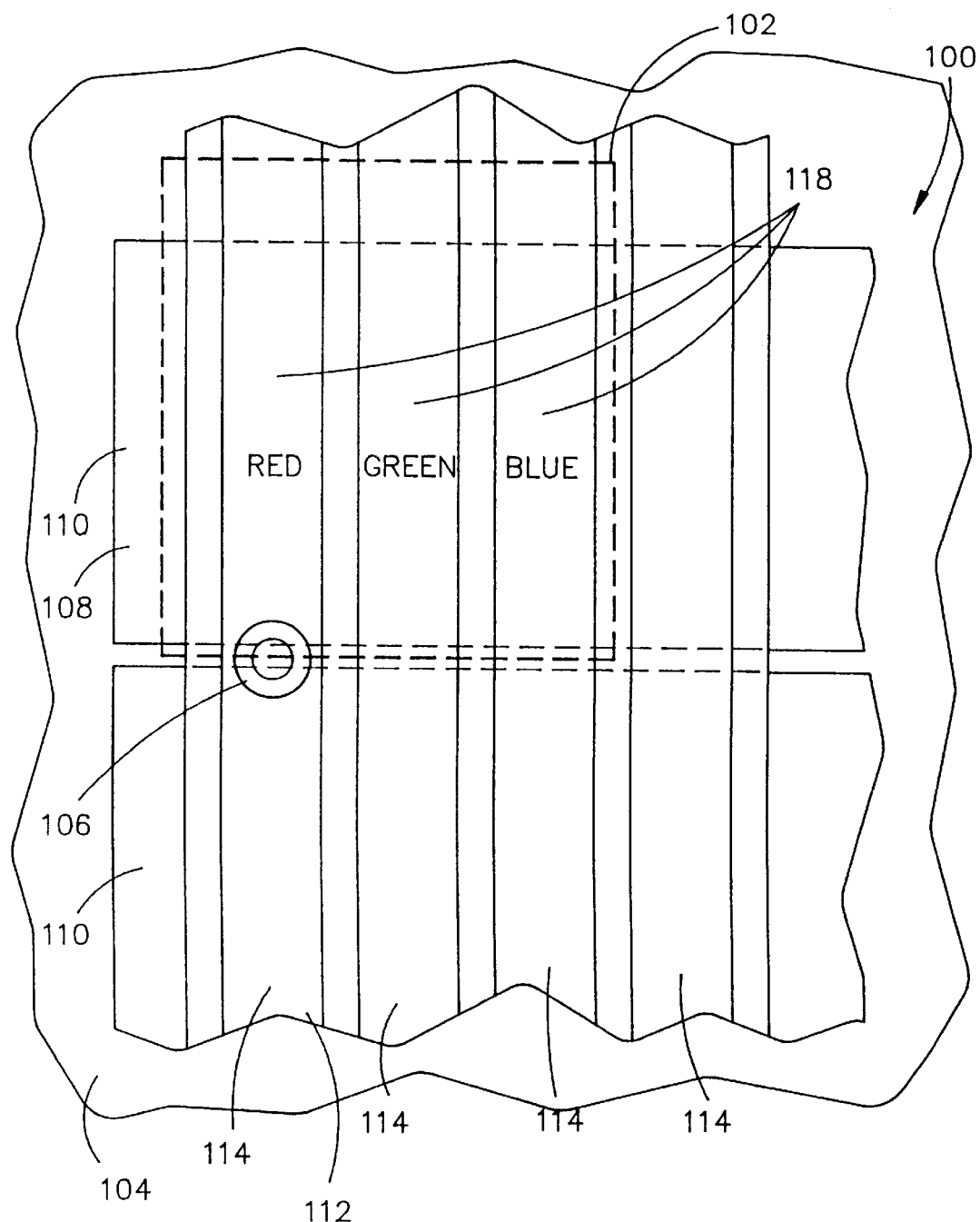
FIG. 6 is a top plan view illustrating an exemplary pixel of a PLED pixel web in accordance with the present invention.

Referring now to FIG. 6, an exemplary picture element or pixel of the PLED pixel web is described. The PLED pixel web 100 shown in FIG. 6 is characteristic of the PLED pixel web of a color flat panel display. Each pixel 102 of the PLED pixel web 100 preferably includes display elements 118 capable of emitting red, green and blue light, respectively. The display elements 118 may be energized to different intensities, creating a range of colors perceived as the mixture of red, green and blue light emitted by the red, green and blue display elements 118. Thus, in an exemplary embodiment, the pixel 102 may produce the color black by having all display elements 118 (red, green and blue) therein turned off, white by having all display elements 118 turned on at full intensity, grays by having all display elements 118 turned on at less than full intensity, red, green and blue by having a respective one of the red, green or blue display elements 118 turned on, and colors other than red, green and blue by having one or more of the red, green and blue display elements 118 turned on at different intensities. In another embodiment, the PLED pixel web 100 may be utilized in a monochrome flat panel display (not shown). Such a PLED pixel web 100 may be comprised of only one display element 118 per pixel 102. The display element 118, normally dark, may be energized to different light intensities, creating a range from dark to light.

Figure 7:
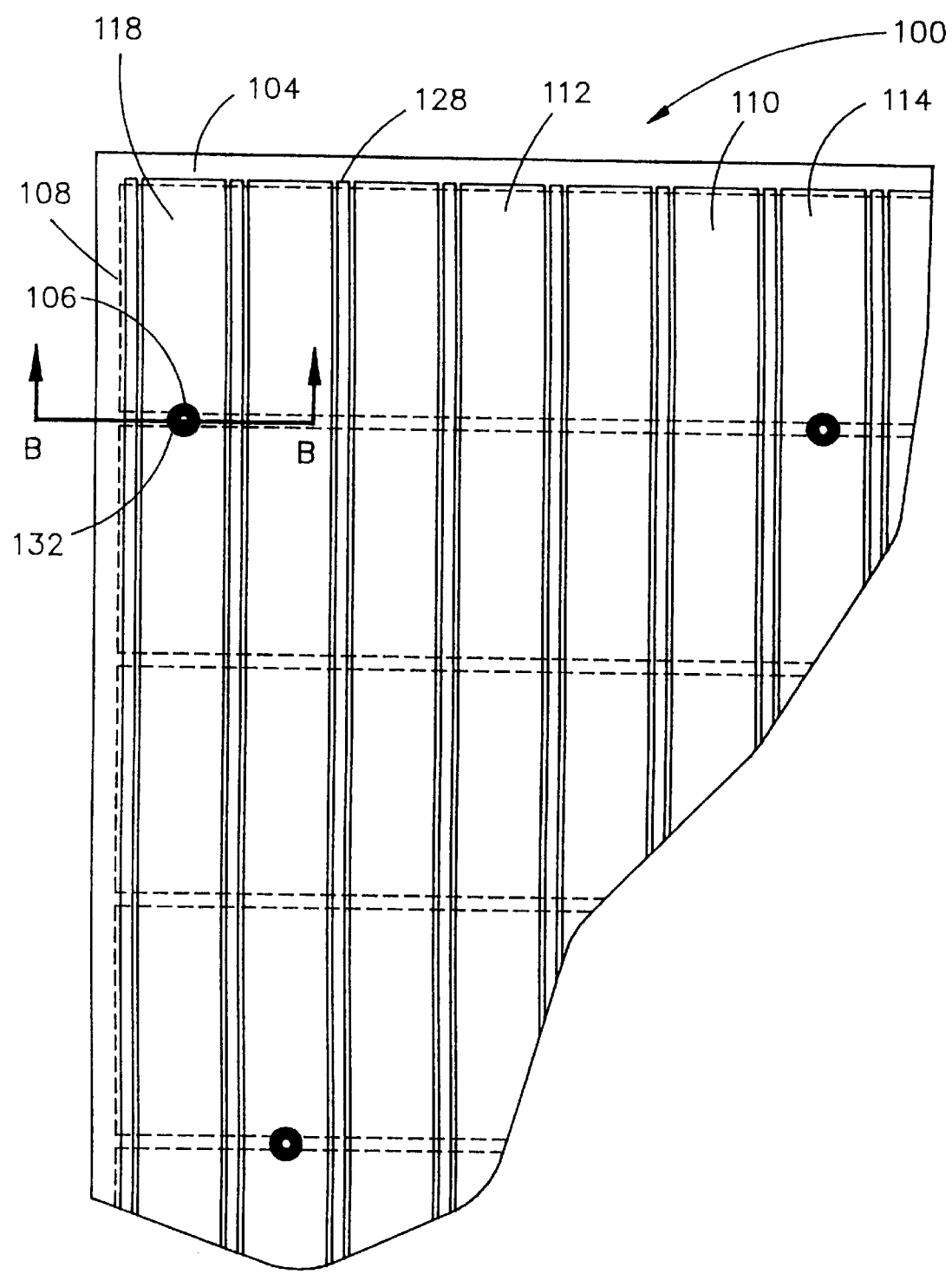
FIG. 7 is a partial view of the PLED pixel web shown in FIG. 1 illustrating the formation of interconnect bumps between rows in accordance with an exemplary embodiment of the invention.

Referring now to FIGS. 7 though 21, in accordance with the present invention interconnects between the PLED pixel web and interconnect substrate may be comprised of interconnect bumps formed within the PLED pixel web shown in FIGS. 1 though 4. Each interconnect bump 132 operably couples the PLED pixel web 100 to the interconnect substrate (not shown) by extending the second electrode layer 112 away from the substrate 104 so the second electrode layer 112 may contact one or more circuit traces of the interconnect substrate. The interconnect bump 132 is preferably formed of a suitable material such as photoresist disposed between the substrate 104 and the second electrode layer 112. Photoresist can naturally form a rounded bump allowing the second electrode layer column 114 to be more easily deposited there over. Preferably, the interconnect bump 132 may be formed using either positive or negative photoresist. For instance, in one embodiment, the interconnect bump 132 may be formed of negative photoresist while the ribs 128 of the PLED pixel web 100 are formed using positive photoresist. Further, the shape of the interconnect bump 132 may be controlled by modifying the exposure source collimation or position or the photoresist itself.

Figure 2:
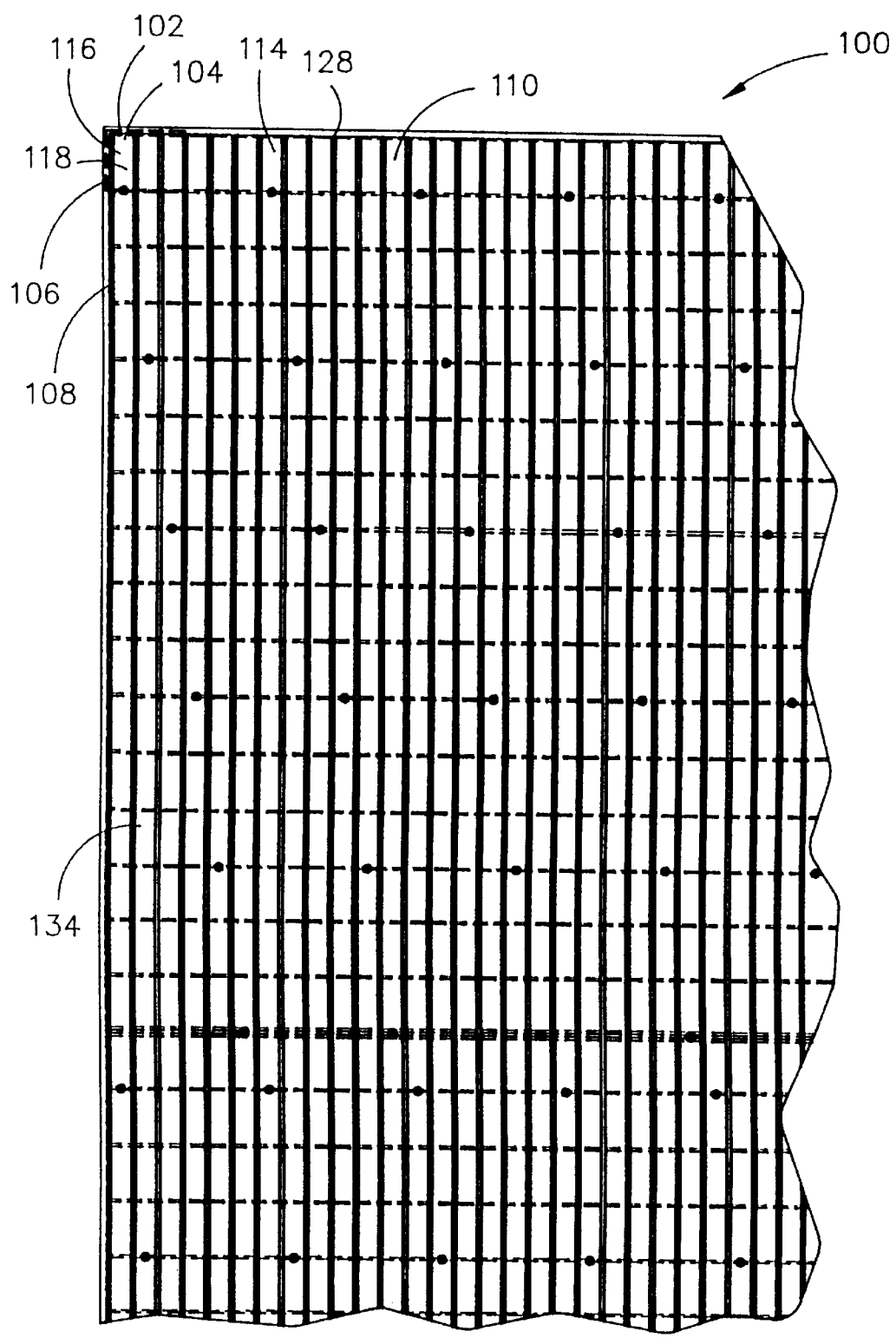
FIG. 2 is an isometric view of a PLED pixel web of a flat panel display in accordance with an exemplary embodiment of the present invention wherein the PLED pixel web is comprised of sixteen rows per segment and wherein the interconnect bumps are formed between rows.

Turning again to FIGS. 1 through 4, rows 110 of the PLED pixel web 100 may be segmented or grouped together to form column segments 134. Connections may then be made between the column segments 134 and the interconnect substrate via interconnects 106 such as interconnect bumps 132 (FIGS. 7 through 21) formed in the PLED pixel web 100. In exemplary embodiments of the invention, the number of rows 110 per column segment 134 may be determined by binary progression (i.e., 2, 4, 8, 16, 32, 64, 128, 256, . . . ). For example, FIGS. 1 and 4 illustrate an exemplary PLED pixel web 100 having eight (8) rows 110 grouped per column segment 134, FIG. 2 illustrates a PLED pixel web 100 having sixteen (16) rows 110 grouped per column segment 134, and FIG. 3 illustrates a PLED pixel web having 32 rows grouped per column segment 134. However, it will be appreciated that in alternate embodiments column segments 134 may be comprised of any practical number of rows 110 without departing from the scope and spirit of the invention. Thus, the number of rows 110 per column segment 134 is not limited to binary progression. As shown in FIGS. 1 through 4, interconnects 106, for example, interconnect bumps 132, may be spaced or staged to form a pattern within the PLED pixel web 100.

Patterning of the interconnects 106, as shown in FIGS. 1 through 4, provides robust alignment of the PLED pixel web 100 with the interface substrate, thereby avoiding shorts between the PLED pixel web 100 and the interconnect substrate. Further, as shown in FIGS. 1 through 4, only one interconnect 106 is required per column segment 134 for providing contact with the interconnect substrate. However, it should be appreciated that multiple interconnects 106 could be provided for each column segment 134 to increase the probability of contact with the interconnect substrate.

As shown in FIGS. 7 through 13, the interconnect bump 132 may be formed between rows 110 of first electrode layer 108 within column segments 134 of second electrode layer 112. Since the bumps 132 may have a diameter (in one embodiment, about 50 $\mu$m) greater than the space between rows 110 (in one embodiment, about 4 $\mu$m), the bump 132 may be centered over the area between rows 110 and may overlap or extend into the rows 110. Thus, the bumps 132 are not completely formed within a display element 118 of the PLED pixel web 100. This positioning may be advantageous since the presence of an interconnect bump 132 may result in some darkening of the display element 118 within which it is formed because of the opacity of the photoresist.

Figure 8:
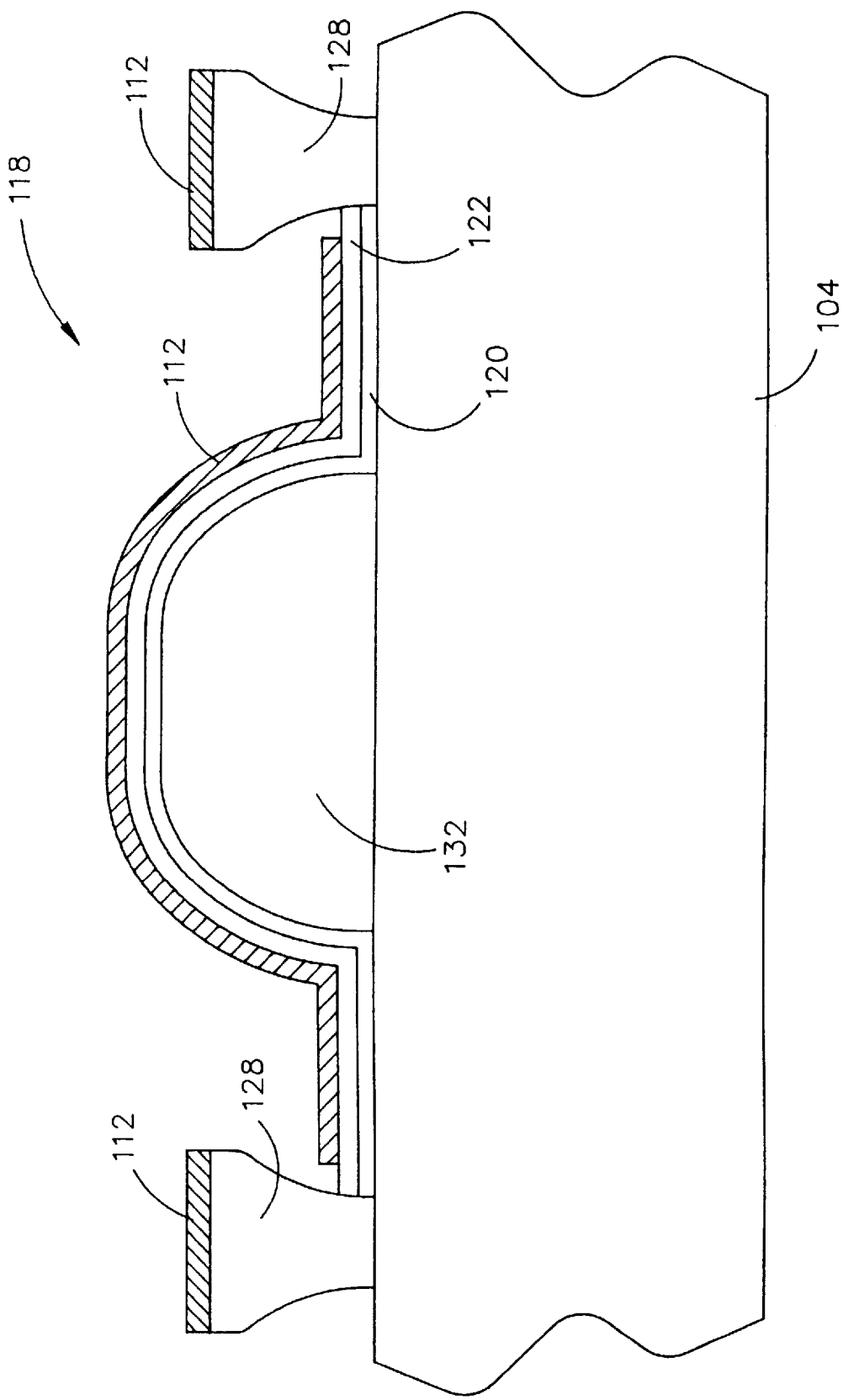
FIGS. 8 through 13 are cross-sectional side elevational views taken along line B—B of FIG. 7, illustrating interconnect bumps formed in accordance with exemplary embodiments of the present invention.

As shown in FIG. 8, the interconnect bump 132 may be formed between the insulating substrate 104 and the hole transport layer 120 of the PLED pixel web 100. Photoresist is deposited onto the insulating substrate 104 over the area between rows 110 of the first electrode layer 108 (FIG. 7) to form the interconnect bump 132. The hole transport layer 120 and electron transport layer 122 are formed over the first electrode layer 108, insulating substrate 104, and interconnect bump 132 so that the hole transport layer 120 and electron transport layer 122 extend over the interconnect bump 132. Similarly, the second electrode 112 is formed on the electron transport layer 122 and ribs 128. In this manner, the second electrode layer 112 is formed over the interconnect bump 132 so as to be extended away from the substrate 104 for contacting the interconnect substrate.

Figure 9:
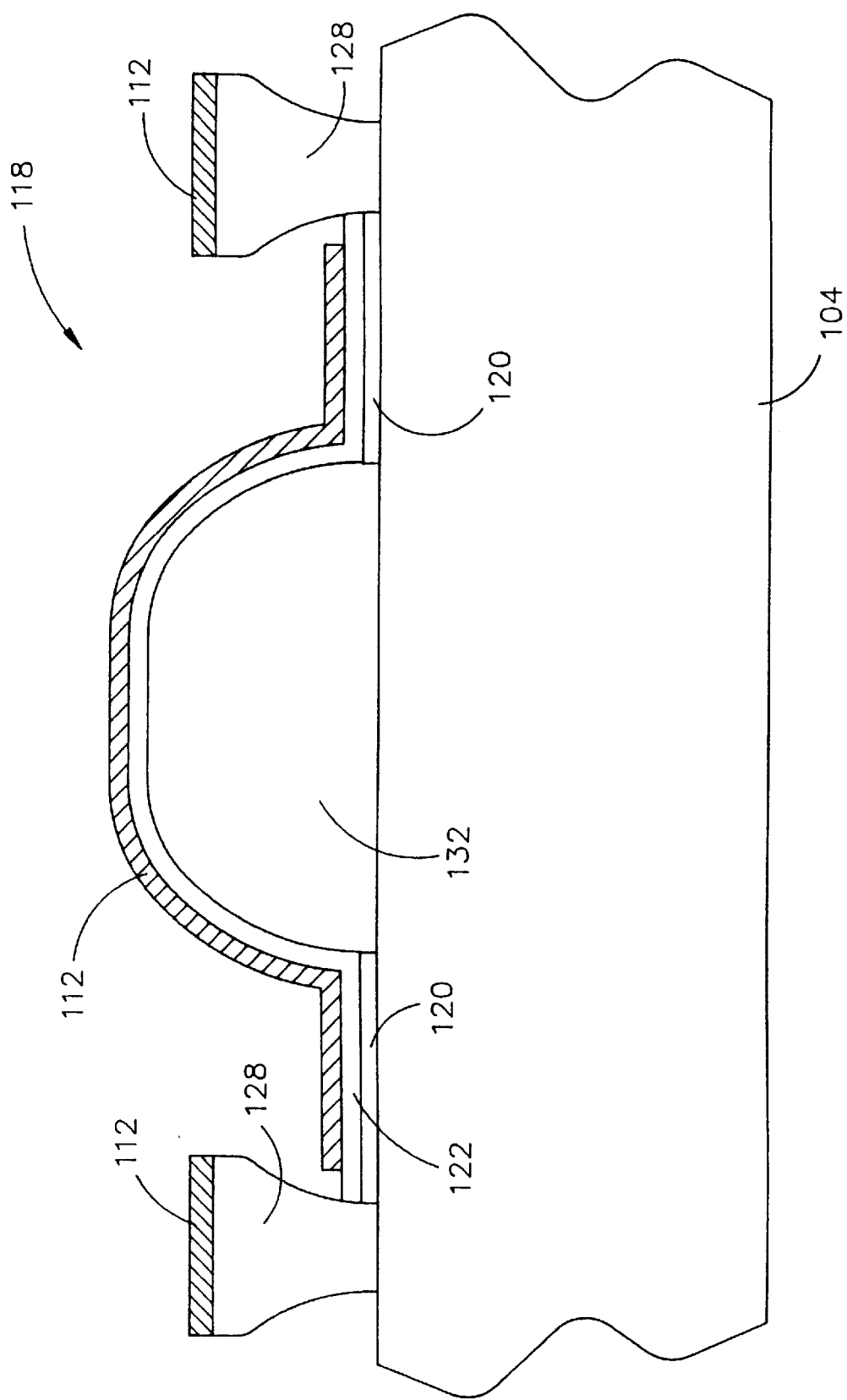

As shown in FIG. 9, the interconnect bump 132 may be formed between the insulating substrate 104 and the electron transport layer 122. Photoresist is deposited onto the insulating substrate 104 over the area between rows 110 of the first electrode layer 108 (FIG. 7) to form the interconnect bump 132. The hole transport layer 120 is formed over the first electrode layer 108 and insulating substrate 104, but does not extend over the interconnect bump 132. The electron transport layer 122 is formed over the hole transport layer 120 and interconnect bump 132. The second electrode layer 112 is then formed on the electron transport layer 122 and ribs 128. Thus, the electron transport layer 122 and second electrode layer 112, but not the hole transport layer 120, extend over the interconnect bump 132.

Figure 10:
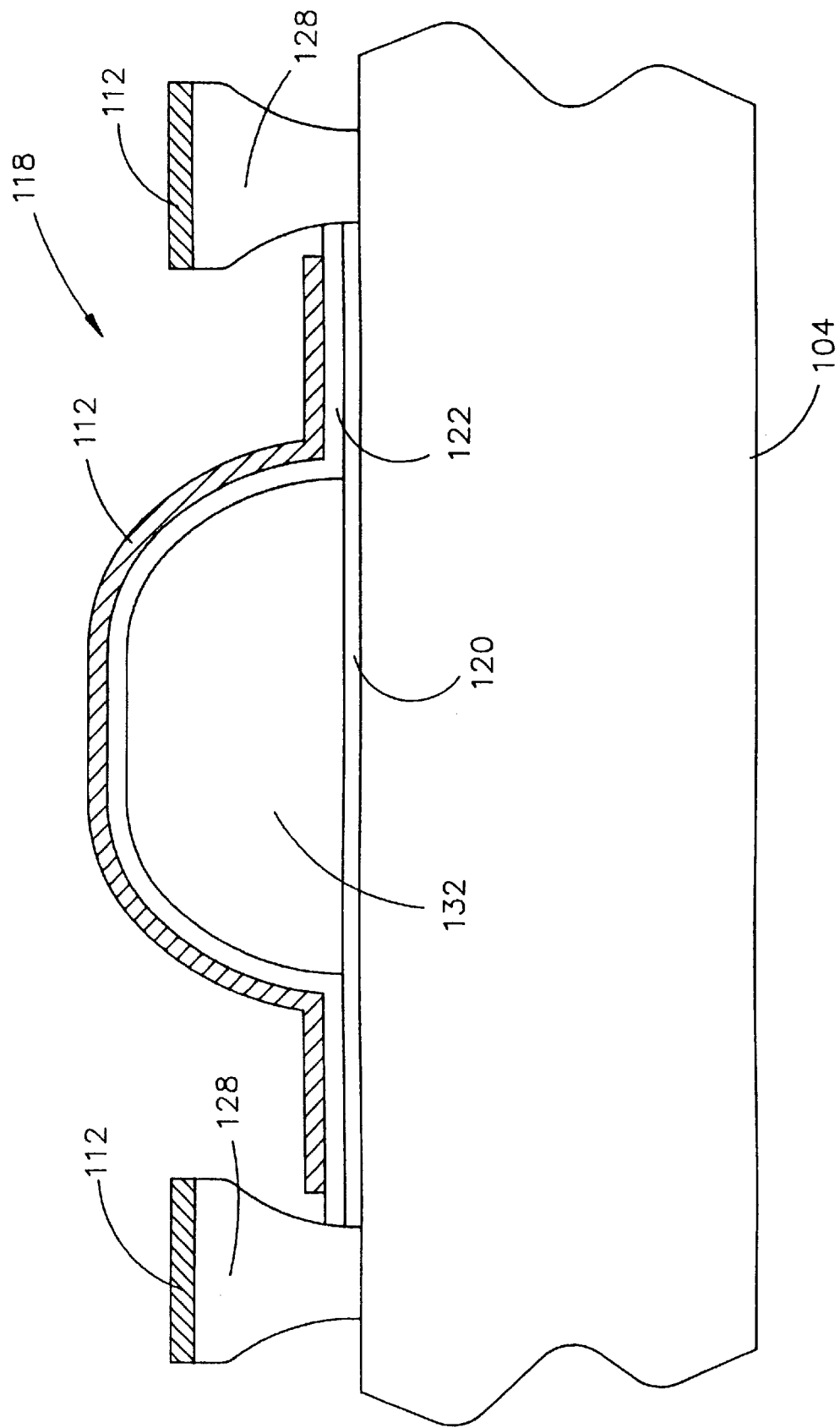

As shown in FIG. 10, the interconnect bump 132 may be formed between the hole transport layer 120 and the electron transport layer 122. The hole transport layer 120 is formed over insulating substrate 104 and first electrode layer 108 (only the area between rows 110 of the first electrode layer 108 is shown). Photoresist is then deposited onto the hole transport layer 120 between rows 110 of the first electrode layer 108 to form the interconnect bump 132. The electron transport layer 122 and second electrode layer 112 may next be formed on the hole transport layer 120 and interconnect bump 132. The second electrode layer 112 is further formed on the ribs 128.

Figure 11:
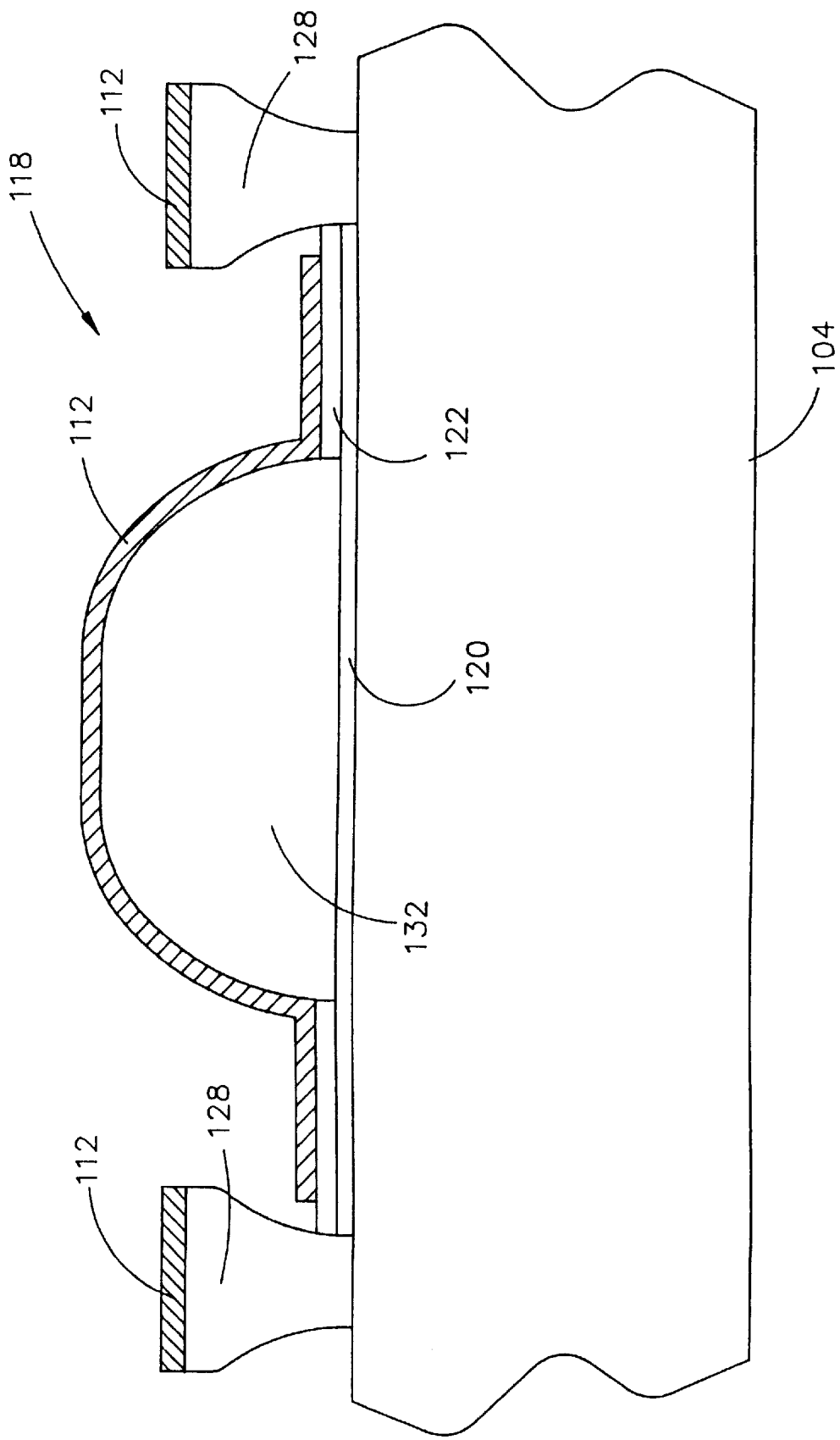

As shown in FIG. 11, the interconnect bump 132 may be formed between the hole transport layer 120 and the second electrode layer 112. The hole transport layer 120 is formed over insulating substrate 104 and first electrode layer 108 (only the area between rows 110 of the first electrode layer 108 is shown). Photoresist is then deposited onto the hole transport layer 120 between rows 110 of the first electrode layer 108 to form the interconnect bump 132. The electron transport layer 122 is formed over the hole transport layer 120 but does not extend over the interconnect bump 132. The second electrode layer 112 is then formed on the hole transport layer 120, interconnect bump 132, and ribs 128. Thus, the second electrode layer 112, but not the hole transport layer 120 and electron transport layer 122, extend over the interconnect bump 132.

Figure 12:
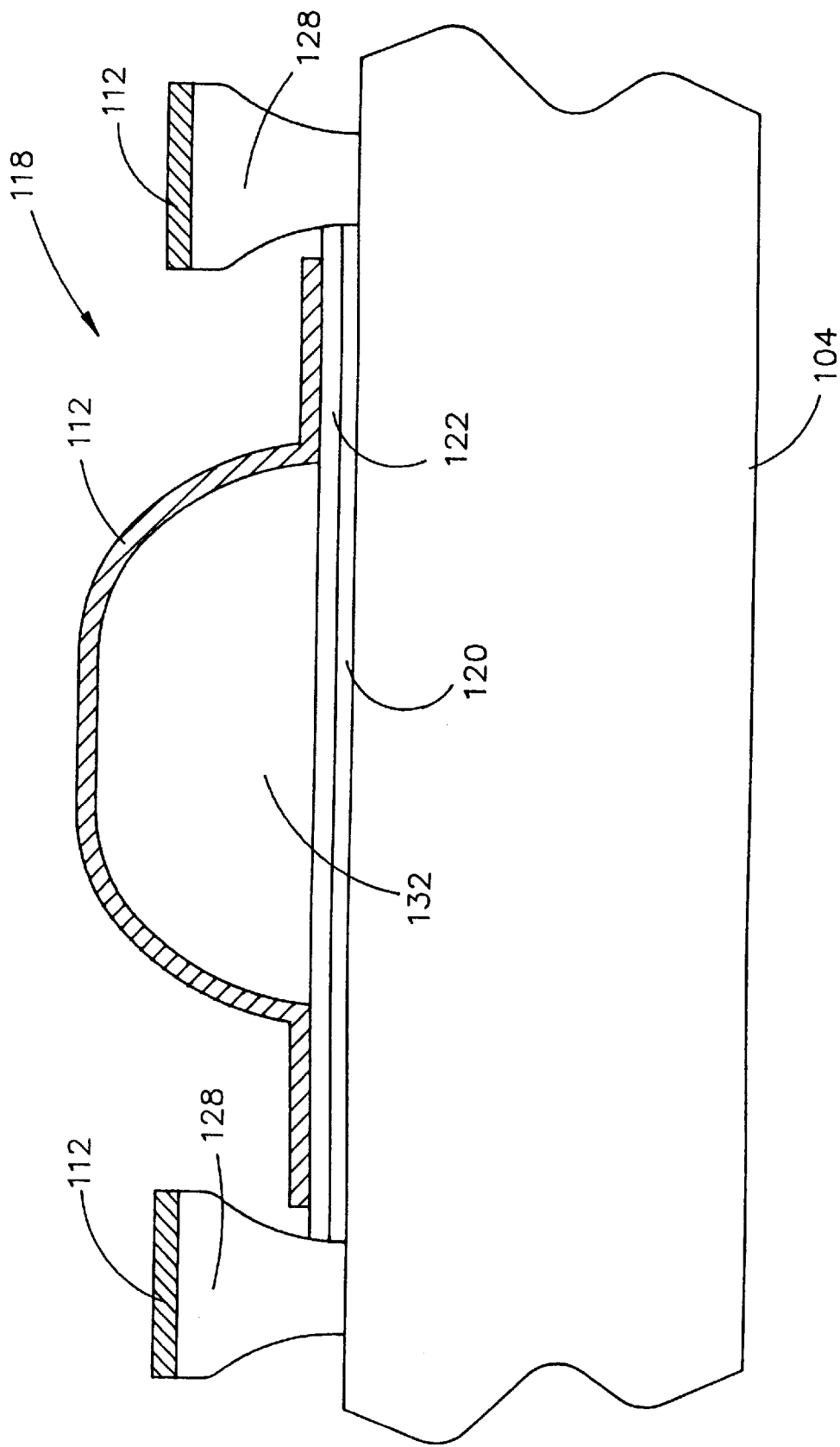

As shown in FIG. 12, the interconnect bump 132 may be formed between the electron transport layer 122 and second electrode layer 112. The hole transport layer 120 and electron transport layer 122 are formed over insulating substrate 104 and first electrode layer 108 (only the area between rows 110 of the first electrode layer 108 is shown). Photoresist is then deposited onto the electron transport layer 122 to form the interconnect bump 132. The second electrode layer 112 is next formed on the electron transport layer 122, interconnect bump 132 and ribs 128 so that only the second electrode layer 112 extends over the interconnect bump 132.

Figure 13:
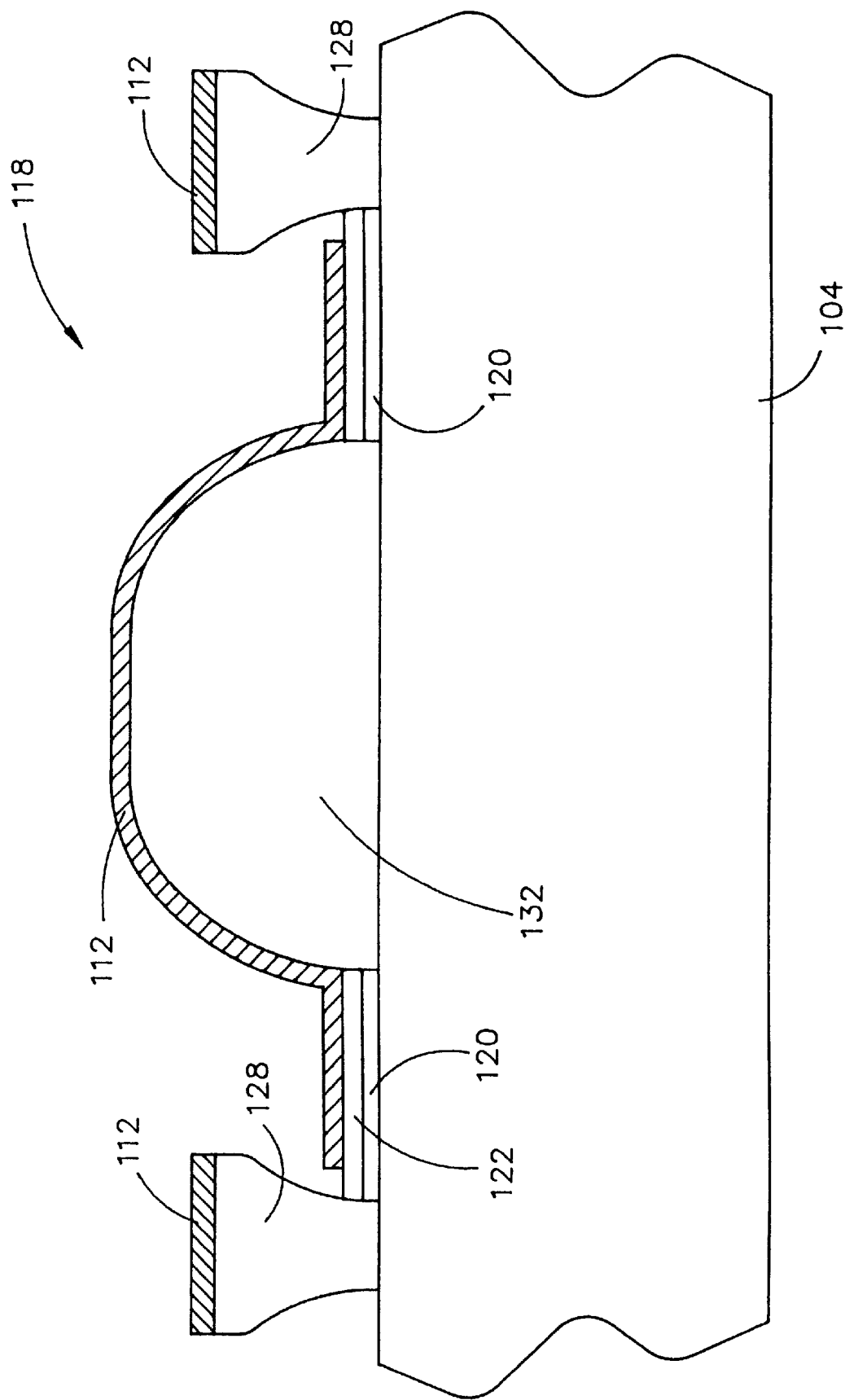
Figure 14:
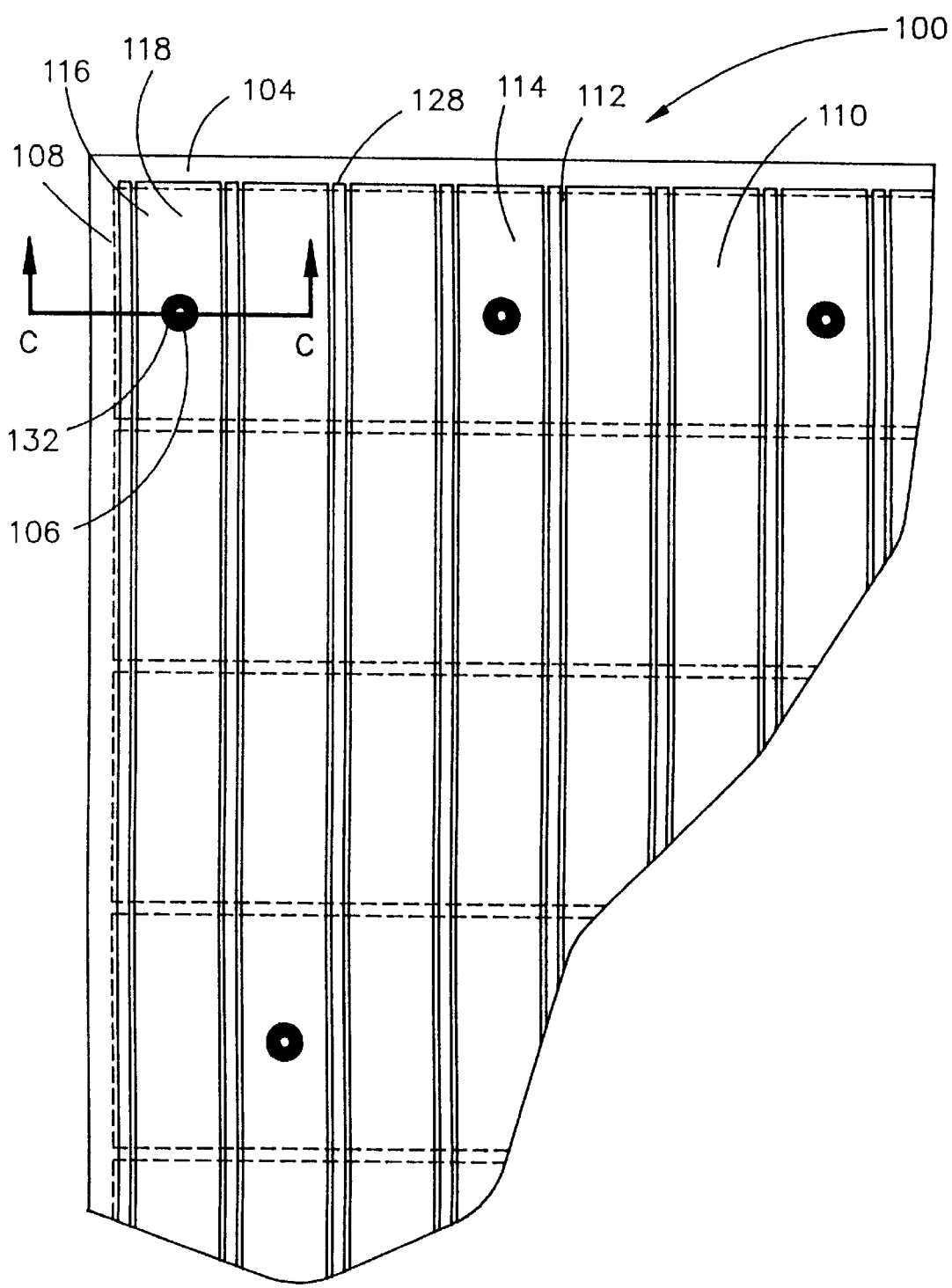
FIG. 14 is a partial view of the PLED pixel web shown in FIG. 4 illustrating the formation of interconnect bumps within display elements of the PLED pixel web in accordance with an alternate embodiment of the invention.

As shown in FIG. 13, the interconnect bump 132 may be formed between the insulating substrate 104 and second electrode layer 112. Photoresist is deposited onto the insulating substrate 104 over the area between rows 110 of the first electrode layer 108 (FIG. 7) to form the interconnect bump 132. The hole transport layer 120 and electron transport layer 122 are formed over insulating substrate 104 and first electrode layer 108 (only the area between rows 110 of the first electrode layer 108 is shown) but do not extend over the interconnect bump 132. The second electrode layer 112 is next be formed on the electron transport layer 122, interconnect bump 132 and ribs 128 so that only the second electrode layer 112 extends over the interconnect bump 132.

Turning now to FIGS. 14 through 21, interconnect bumps 132 may alternately be formed within the area of intersection 116 defining the display element 118. However, it will be appreciated that this positioning may result in an area of a display element 118 having an interconnect bump 132 formed therein being darkened thereby causing the display element 118 to emit less light.

Figure 15:
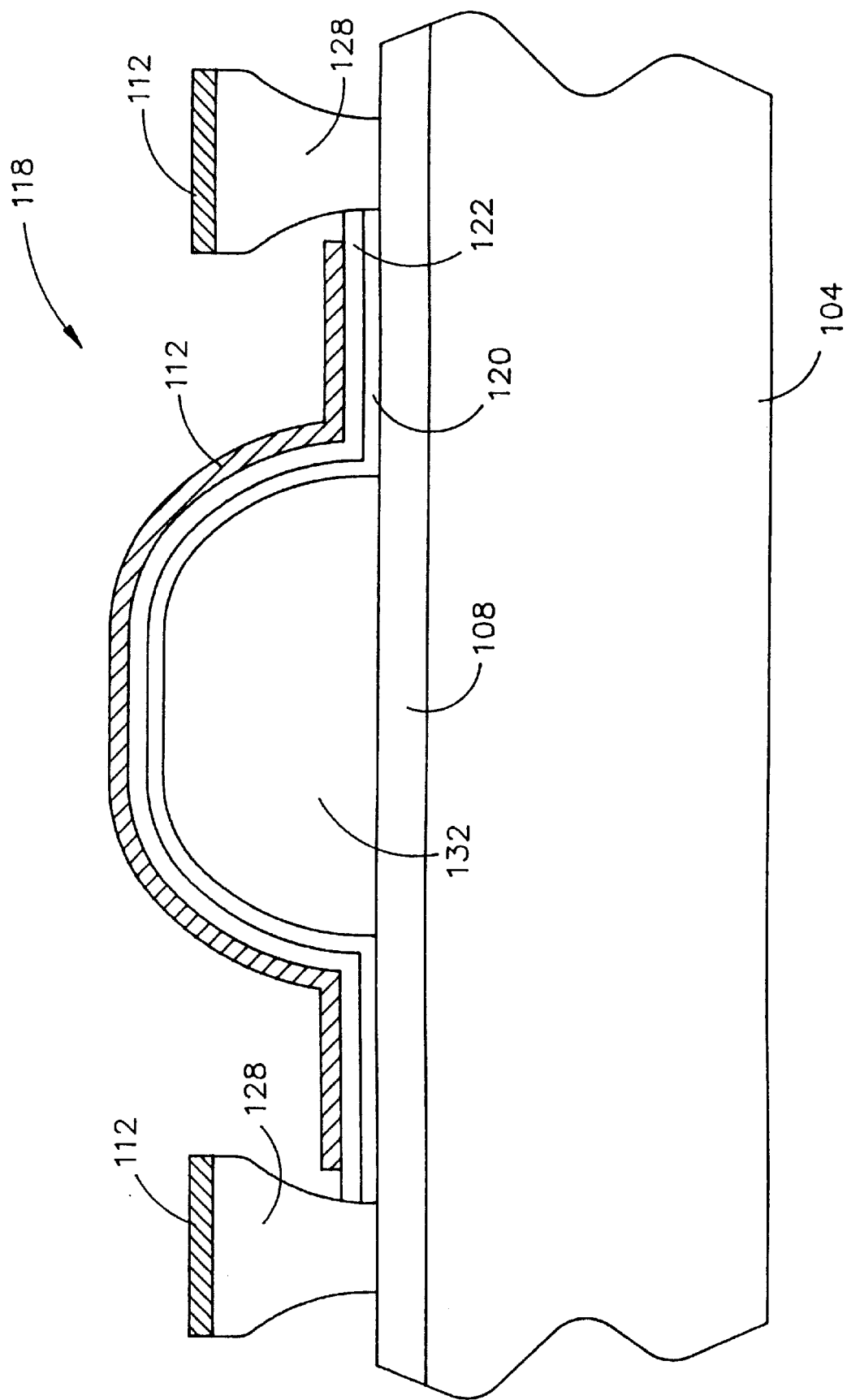
FIGS. 15 through 21 are cross-sectional side elevational views taken along line C—C of FIG. 14, illustrating interconnect bumps formed in accordance with exemplary embodiments of the present invention.

As shown in FIG. 15, the interconnect bump 132 may be formed between the first electrode layer 108 and the hole transport layer 113 of the PLED pixel web 100. The first electrode layer 108 is formed on insulating substrate 104. Photoresist is deposited onto the first electrode layer 108 to form the interconnect bump 132 and ribs 128. The hole transport layer 120 and electron transport layer 122 are next formed over the first electrode layer 108 and interconnect bump 132 so that the hole transport layer 120 and electron transport layer 122 extend over the interconnect bump 132. Similarly, the second electrode layer 112 is formed on the hole transport layer 120 and ribs 128. In this manner, the second electrode layer 112 is formed over the interconnect bump 132 so as to be extended away from the substrate 104 for contacting the interconnect substrate.

Figure 16:
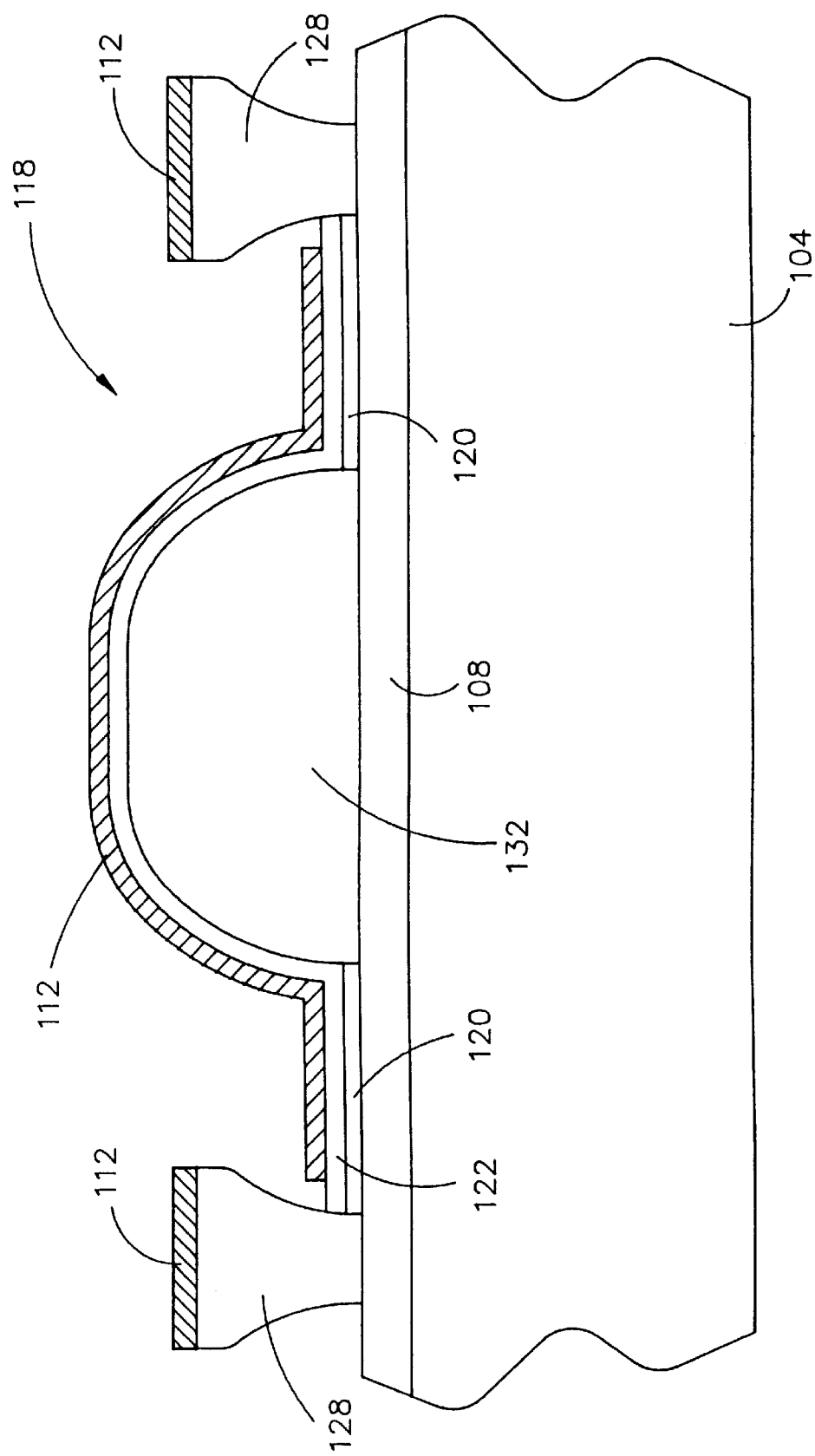

As shown in FIG. 16, the interconnect bump 132 may be formed between the first electrode layer 108 and the electron transport layer 122. The first electrode layer 108 is formed on insulating substrate 104. Photoresist is then deposited over the first electrode layer 108 to form the interconnect bump 132 and ribs 128. The hole transport layer 120 is formed over the first electrode layer 108 but does not extend over the interconnect bump 132. The electron transport layer 122 is formed over the hole transport layer 120 and interconnect bump 132. The second electrode layer 112 is then formed on the hole transport layer 120 and ribs 128. Thus, the electron transport layer 122 and second electrode layer 112, but not the hole transport layer 120, extend over the interconnect bump 132.

Figure 17:
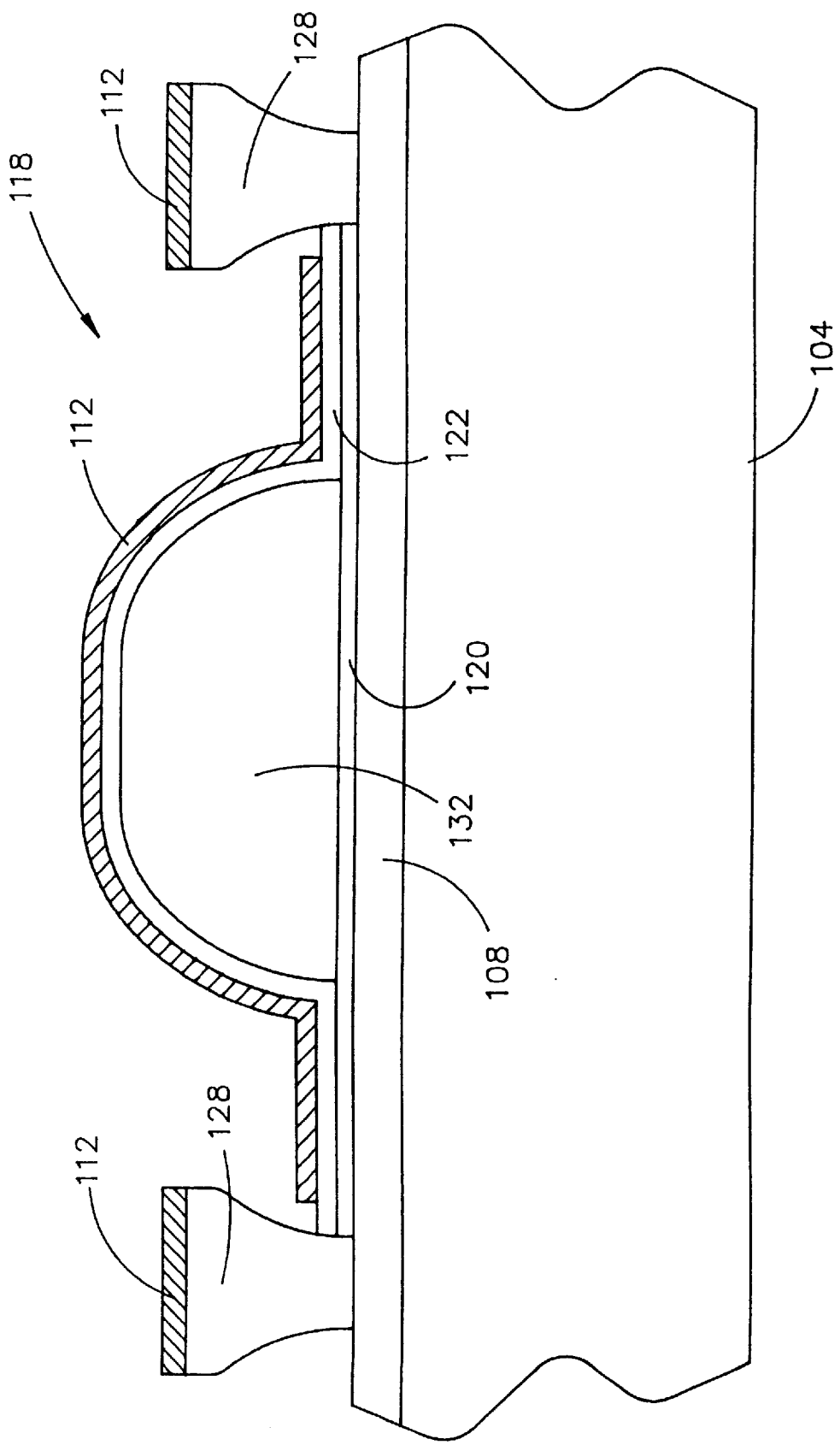

As shown in FIG. 17, the interconnect bump 132 may be formed between the hole transport layer 120 and the electron transport layer 122. The first electrode layer 108 is formed on the insulating substrate 104. Photoresist is deposited over the first electrode layer 108 and insulating substrate 104 to form ribs 128. The hole transport layer 120 is next formed over the first electrode layer 108. Photoresist is then deposited onto the hole transport layer 120 to form the interconnect bump 132. The electron transport layer 122 and second electrode layer 112 may next be formed on the hole transport layer 120 and interconnect bump 132. The second electrode layer 112 is further formed on the ribs 128.

Figure 18:
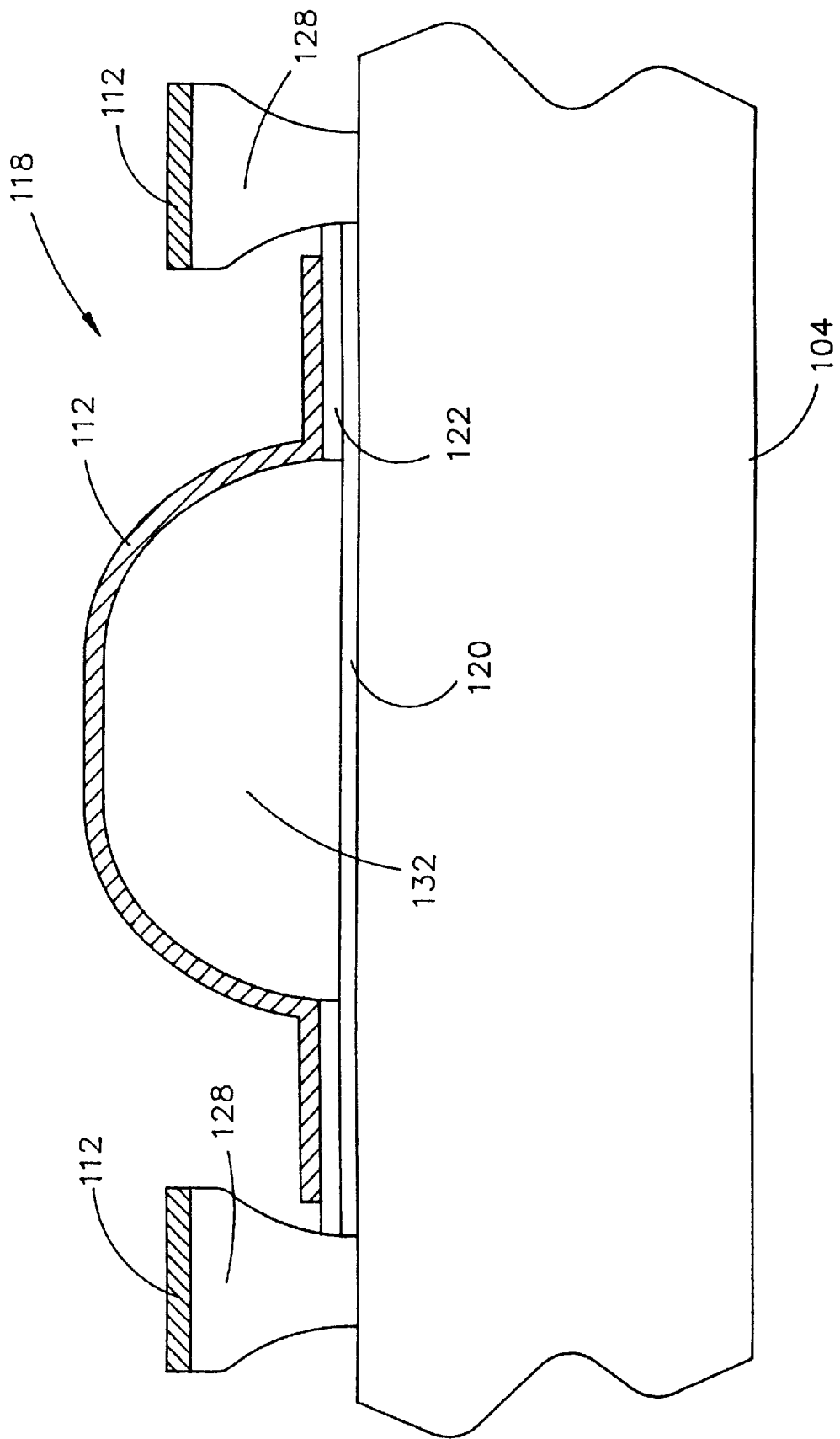

As shown in FIG. 18, the interconnect bump 132 may be formed between the hole transport layer 120 and the second electrode layer 112. The first electrode layer 108 is initially formed on insulating substrate 104. Photoresist is deposited on the first electrode layer 108 and insulating substrate 104 to form ribs 128. The hole transport layer 120 is then formed on the first electrode layer 108. Photoresist is deposited on the hole transport layer 120 to form the interconnect bump 132. The electron transport layer 122 is next formed over the hole transport layer 120 but does not extend over the interconnect bump 132. The second electrode layer 112 is then formed on the hole transport layer 120, interconnect bump 132, and ribs 128. Thus, the second electrode layer 112, but not the hole transport layer 120 and electron transport layer 122, extend over the interconnect bump 132.

Figure 19:
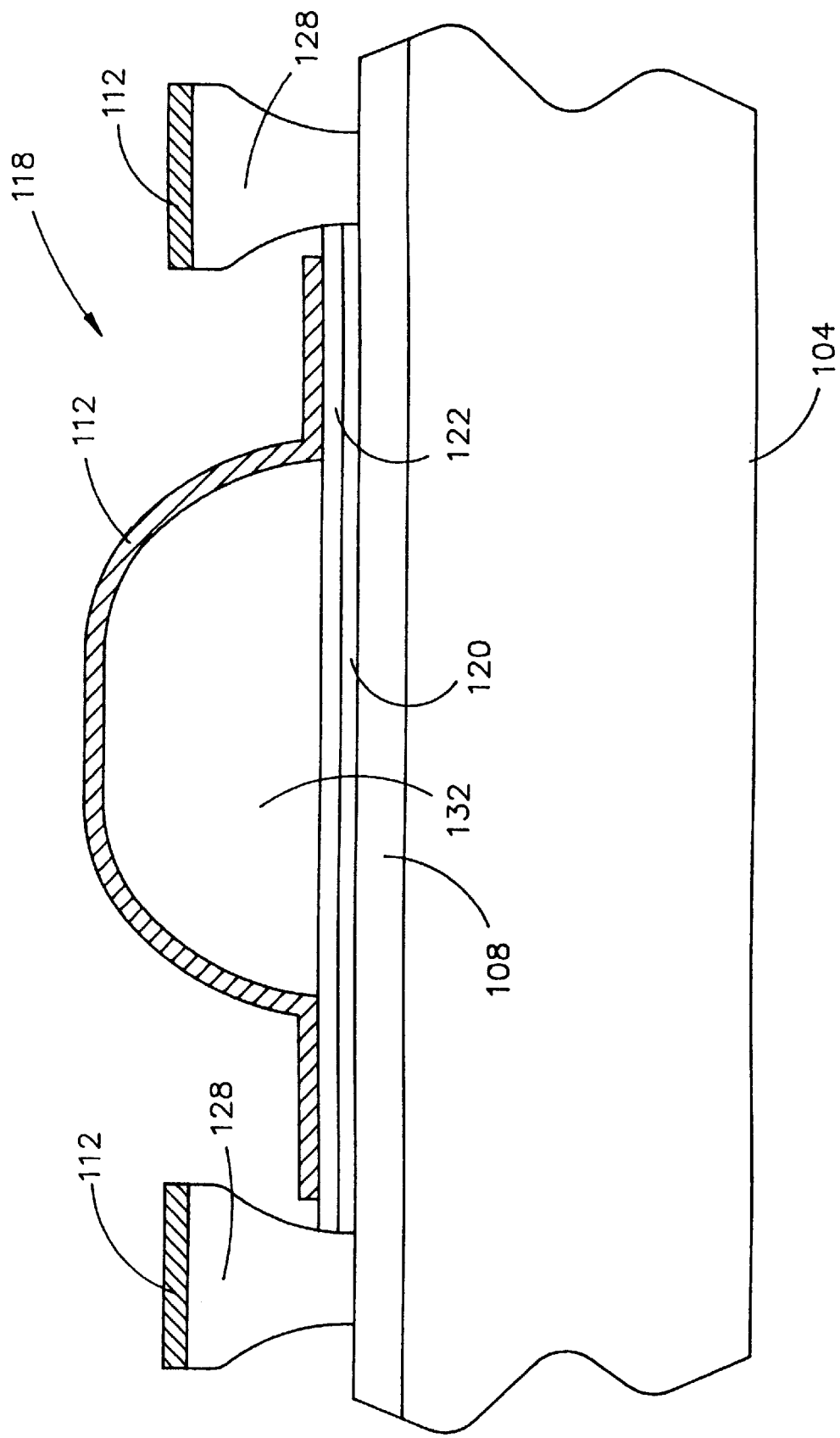

As shown in FIG. 19, the interconnect bump 132 may be formed between the electron transport layer 122 and second electrode layer 112. The first electrode layer 108 is initially formed on substrate 104. Photoresist is deposited over the first electrode layer 108 and insulating substrate to form ribs 128. The hole transport layer 120 and electron transport layer 122 are next formed over the first electrode layer 108. Photoresist is then deposited onto the electron transport layer 122 to form the interconnect bump 132. The second electrode layer 112 may next be formed on the electron transport layer 122 and interconnect bump 132 and ribs 128.

Figure 20:
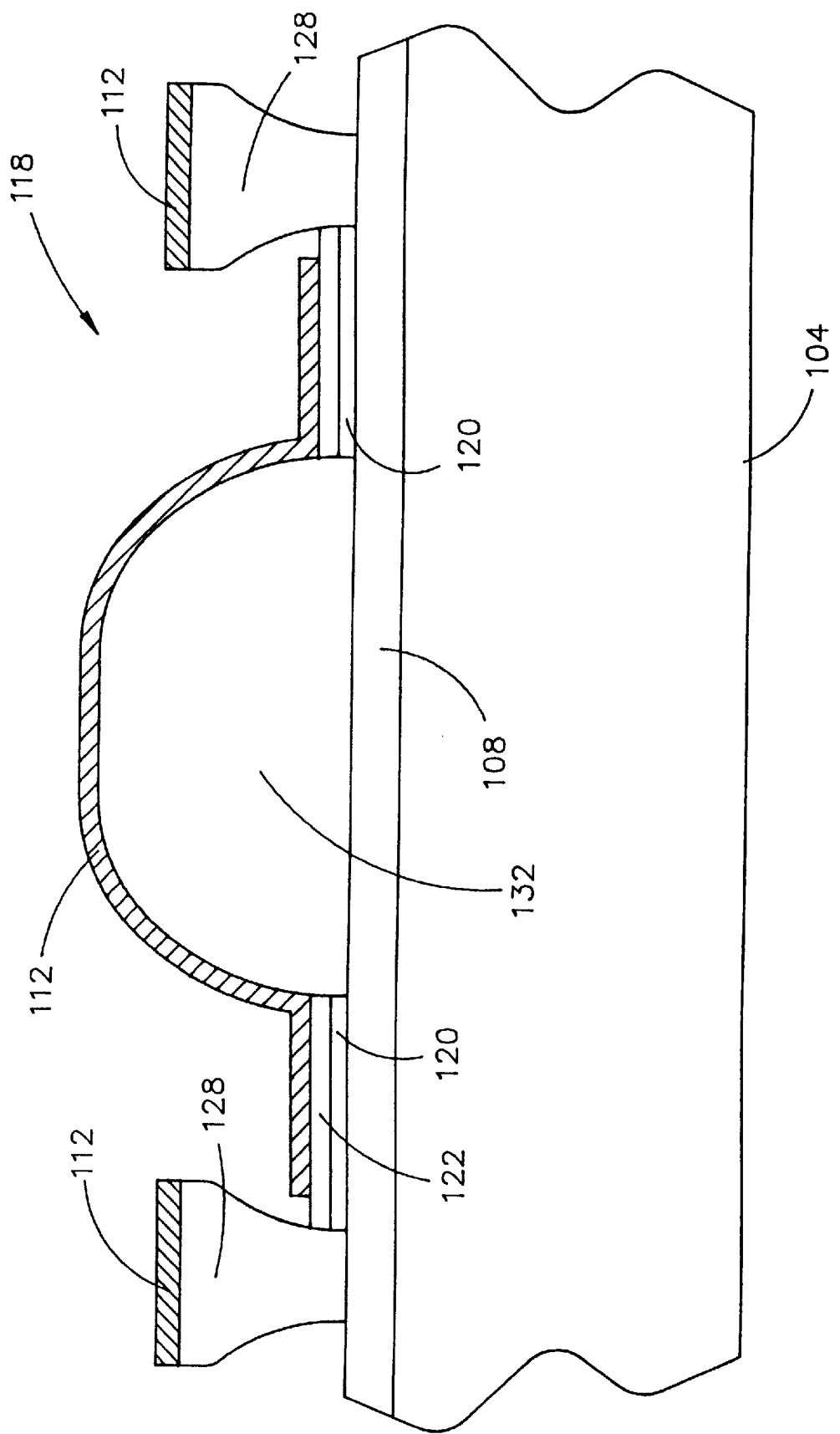

As shown in FIG. 20, the interconnect bump 132 may be formed between the insulating substrate 104 and second electrode layer 112. The first electrode layer 108 is formed on the insulating substrate 104. Photoresist is deposited the first electrode layer 108 to form the interconnect bump 132 and ribs 128. The hole transport layer 120 and electron transport layer 122 are formed over insulating substrate 104 and first electrode layer 108 but do not extend over the interconnect bump 132. The second electrode layer 112 is next formed on the electron transport layer 122, interconnect bump 132 and ribs 128 so that only the second electrode layer 112 extends over the interconnect bump 132.

Figure 21:
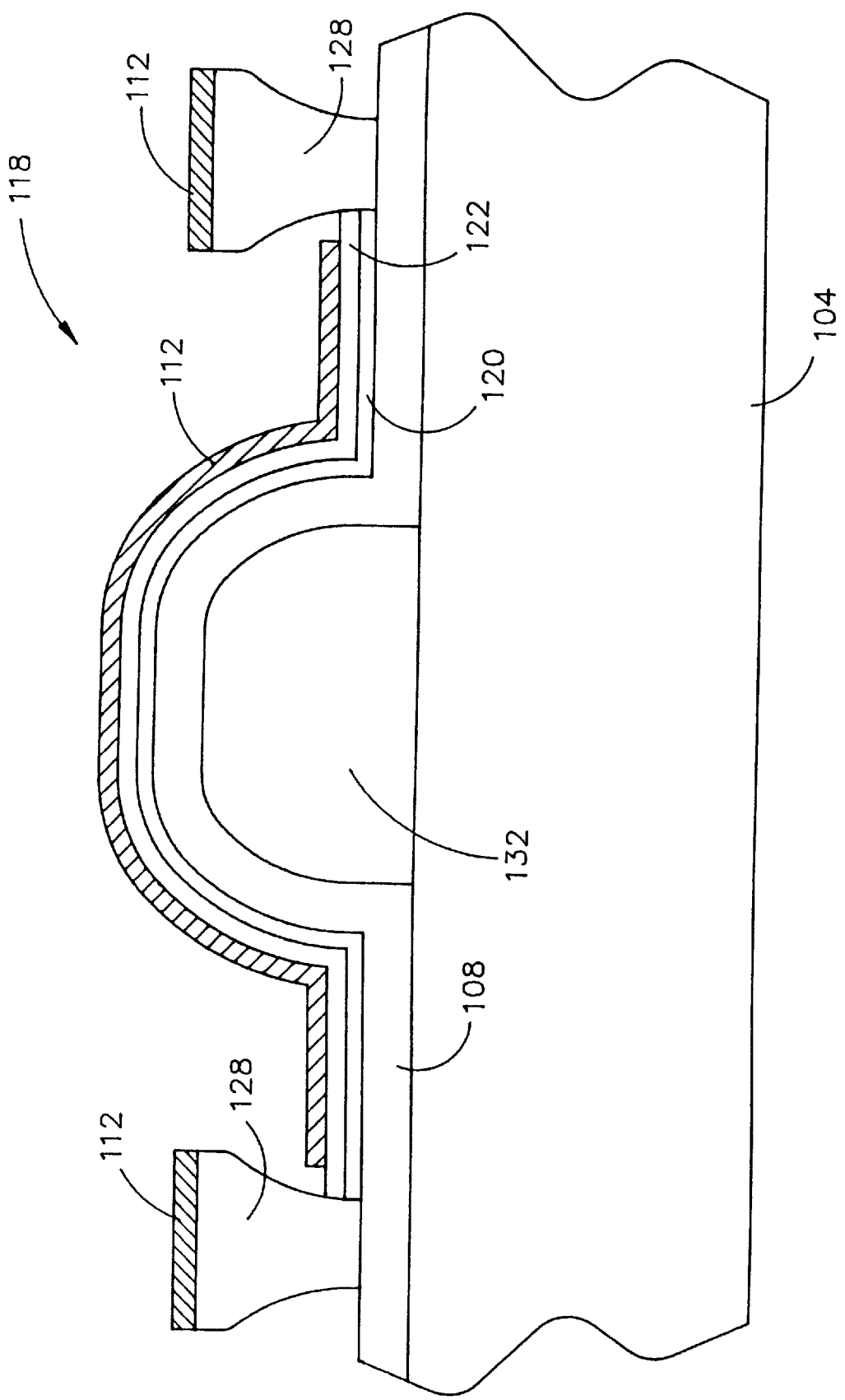

As shown in FIG. 21, the interconnect bump 132 of the present invention may be formed between the insulating substrate 104 and the first electrode layer 108 of the PLED pixel web 100. The interconnect bump 132 may be formed on the insulating substrate 104 via substrate sandblasting and the addition of bumping material such as photoresist. The first electrode layer 108 is formed over the interconnect bump 132 on the insulating substrate 104. Photoresist is deposited onto the first electrode layer 108 to form ribs 128.

The hole transport layer 120 and electron transport layer 122 and are formed on the first electrode layer 108. Similarly, the second electrode layer 112 is formed on the hole transport layer 120 and ribs 128. In this manner, the second electrode layer 112 may be extended over the interconnect bump 132, first electrode layer 108, hole transport layer 120, and electron transport layer 122 so as to be extended away from the substrate 104 for contacting the interconnect substrate.

It should be understood that the specific order, or hierarchy, of steps disclosed herein in FIGS. 8 through 13 and 15 through 21 for forming the interconnect bump are examples of preferred approaches. Based upon design preferences, it is understood that the specific order, or hierarchy, can be rearranged while remaining within the scope of the present invention. The attached claims present steps for forming the interconnect bump in a sample order, and are not meant to be limited to the specific order or hierarchy presented.

In FIGS. 8 through 13 and 15 through 21, layers formed over the interconnect bump 132 are illustrated as having uniform thicknesses. However, it should be appreciated that FIGS. 8 through 13 and 15 through 21 are simplified to more clearly describe features of the invention. Thus, during actual production of pixel webs for flat panel displays utilizing the interconnect bump 132 of the present invention, such layers may in fact have a non-uniform thicknesses. For instance, one or more layers may become somewhat thinner where they extend over the interconnect bump 132. Further, the size of elements such as rows 110, columns 114, and display elements 118 within the PLED pixel webs 100 shown herein is somewhat exaggerated to more clearly illustrate features of the invention. These elements would likely be extremely small and therefore difficult to view with the unaided eye. For example, an exemplary display element 118 of a PLED pixel web 100 may have dimensions of a approximately 300 μm (i.e., row height) by 100 μm (i.e., column width). Finally, while the present invention is described herein in accordance with an exemplary embodiment wherein the interconnect bump 132 is employed in a polymer light emitting diode (PLED) flat panel display, it will be appreciated by those skilled in the art that the interconnect bump 132 disclosed herein may also be employed in a wide variety of flat panel display technologies including, but not limited to, liquid crystal display (LCD), field emission display (FED), and plasma display technologies.

It is believed that the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A flat panel light emitting device, comprising:
   a substrate;
   a first electrode disposed on said substrate;
   a second electrode disposed over said first electrode layer and said
   substrate; and
   a bump formed between said substrate and said second electrode;
   wherein said bump is suitable for extending said second electrode away from
   said substrate so said second electrode may be operably coupled to
   an interconnect substrate.

2. The flat panel light emitting device as claimed in claim 1, wherein said bump is formed of photoresist.

3. The flat panel light emitting device as claimed in claim 1, further comprising:
   a hole transport layer formed over said first electrode;
   an electron transport layer formed over said hole transport layer;
   wherein said bump is formed on one of said substrate, said first electrode, said hole transport layer, and said electron transport layer.

4. The flat panel light emitting device as claimed in claim 3, wherein said hole transport layer and said electron transport layer comprise semi-conducting light emitting polymers.

5. The flat panel light emitting device as claimed in claim 1, wherein said first electrode layer is formed into a plurality of rows and said second electrode is formed into at least one column intersecting said plurality of rows, and wherein said bump is formed in at least one of the area of intersection 116 of a row and said column and the area between said rows within said column.

6. The flat panel light emitting device as claimed in claim 1, further comprising a rib formed over said substrate adjacent to said bump for forming said second electrode layer into column conductors.

7. The flat panel light emitting device as claimed in claim 6, wherein said rib is formed of photoresist.

8. A pixel web of a flat panel display, comprising:
   a substrate;
   a first electrode layer disposed on said substrate, said first electrode layer formed into a plurality of rows;
   a second electrode layer formed over said first electrode layer, said second electrode layer formed into a plurality of columns intersecting said rows wherein the area of intersection of a row and a column forms a display element of the pixel web; and
   at least one bump formed between said second electrode layer and said substrate;
   wherein said bump is suitable for extending said second electrode layer away from the substrate so said second electrode layer may be operably coupled to an interconnect substrate.

9. The pixel web as claimed in claim 8, wherein said bump is formed of photoresist.

10. The pixel web as claimed in claim 8, further comprising:
    a hole transport layer formed over said first electrode;
    an electron transport layer formed over said hole transport layer;
    wherein said bump is formed on one of said substrate, said first electrode, said hole transport layer, and said electron transport layer.

11. The pixel web as claimed in claim 10, wherein said hole transport layer and said electron transport layer comprise semi-conducting light emitting polymers.

12. The pixel web as claimed in claim 8, wherein said bump is formed in at least one of an element of the pixel web and the area between said rows within a column.

13. The pixel web as claimed in claim 12, comprising a plurality of said bumps wherein said bumps are spaced to form a pattern of bumps within said pixel web for providing alignment of said pixel web with said interface substrate.

14. The pixel web as claimed in claim 8, further comprising a rib formed over said substrate adjacent to said bump for forming said second electrode layer into column conductors.

15. The pixel web as claimed in claim 14, wherein said rib is formed of photoresist.

* * * * *